(12) United States Patent
Zhou

(10) Patent No.: US 10,833,177 B2
(45) Date of Patent: Nov. 10, 2020

(54) SEMICONDUCTOR DEVICE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shanghai (CN)

(73) Assignees: Semiconductor Manufacturing International (Beijing) Corporation, Beijing (CN); Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 16/529,290

(22) Filed: Aug. 1, 2019

(65) Prior Publication Data

US 2020/0044046 A1    Feb. 6, 2020

(30) Foreign Application Priority Data

Aug. 1, 2018  (CN) .......................... 2018 1 0863577

(51) Int. Cl.
| | | |
|---|---|---|
| *H01L 21/336* | (2006.01) | |
| *H01L 21/311* | (2006.01) | |
| *H01L 29/76* | (2006.01) | |
| *H01L 29/94* | (2006.01) | |
| *H01L 31/062* | (2012.01) | |
| *H01L 31/113* | (2006.01) | |
| *H01L 31/119* | (2006.01) | |
| *H01L 29/66* | (2006.01) | |
| *H01L 29/78* | (2006.01) | |
| *H01L 29/417* | (2006.01) | |

(52) U.S. Cl.
CPC .... *H01L 29/6681* (2013.01); *H01L 29/41791* (2013.01); *H01L 29/66803* (2013.01); *H01L 29/785* (2013.01)

(58) Field of Classification Search
CPC ........... H01L 29/6681; H01L 29/41791; H01L 29/66803; H01L 29/785
USPC ................................. 438/283, 696; 257/365
See application file for complete search history.

(56) References Cited

U.S. PATENT DOCUMENTS

2016/0240650 A1* 8/2016 Chang ............... H01L 29/42372
2017/0309624 A1* 10/2017 Cheng ............. H01L 21/823431
(Continued)

*Primary Examiner* — David S Blum
(74) *Attorney, Agent, or Firm* — Anova Law Group, PLLC

(57) ABSTRACT

Semiconductor device and fabrication method are provided. The method includes: providing a substrate having a fin which has first fin layers and second fin layers; forming a dummy gate structure across the fin; after forming the dummy gate structure, respectively forming a first groove and a second groove in the fin on two sides of the dummy gate structure; removing a portion of the second fin layer adjacent to the first groove to form a first fin recess; removing a portion of the second fin layer adjacent to the second groove to form a second fin recess; forming a first spacer layer in the first fin recess and forming a second spacer layer in the second fin recess; after forming the first spacer layer, forming a doped drain layer in the first groove; and after forming the second spacer layer, forming a doped source layer in the second groove.

20 Claims, 7 Drawing Sheets

(56) References Cited

U.S. PATENT DOCUMENTS

2019/0319098 A1\* 10/2019 Tai ..................... H01L 29/7848
2020/0126843 A1\* 4/2020 Tsai ................... H01L 29/6653
2020/0176581 A1\* 6/2020 Lee ................ H01L 21/823828

\* cited by examiner

SEMICONDUCTOR DEVICE AND FABRICATION METHOD THEREOF

CROSS-REFERENCE TO RELATED APPLICATION

This application claims the priority of Chinese Patent Application No. 201810863577.3, filed on Aug. 1, 2018, the content of which is incorporated herein by reference in its entirety.

TECHNICAL FIELD

The present disclosure generally relates to the field of semiconductor manufacturing and, more particularly, relates to a semiconductor device and its fabrication method.

BACKGROUND

With the rapid development of semiconductor technology, the semiconductor devices present a development trend of high element density and high integration. Currently, the semiconductor devices, as the most basic devices, are widely used. The conventional planar devices have a weak controlling ability of a channel current, which may cause the short-channel effect and leakage current, thereby affecting the electrical performance of the semiconductor devices.

In order to overcome the short-channel effect and control the leakage current, a fin field effect transistor (FinFET), which is a common multi-gate device, has been used in the conventional technology. The structure of the FinFET may include fins and spacer layers on a semiconductor substrate surface where the spacer layers may cover a portion of the sidewalls of the fins and the top surface of the spacer layers may be lower than the top of the fins, gate structures on the surface of the spacer layers and on top surfaces and sidewall surfaces of the fins, and a source region and a drain region in the fin on two sides of each gate structure.

With the ever-increasing demands placed on the device performance, a four-sided controlled gate-all-around structure has been created. The semiconductor device having a gate-all-around structure may have special features, which may effectively limit the short-channel effect and may be highly desirable in the industry's innovation with continuous reduction of the device size according to Moore's law. A device channel consisting of a thin silicon film in the gate-all-around structure may be surrounded by the device gate and also be controlled by the gate.

However, the semiconductor devices formed by the conventional technology may have poor performance.

SUMMARY

One aspect of the present disclosure provides a method for fabricating a semiconductor device. The method includes: providing a substrate having a fin, where the fin has a plurality of first fin layers stacked along a normal direction of a substrate surface and a second fin layer between two adjacent first fin layers; forming a dummy gate structure across the fin, where the dummy gate structure covers a portion of a top surface and sidewall surfaces of the fin; after forming the dummy gate structure, respectively forming a first groove and a second groove in the fin on two sides of the dummy gate structure; removing a portion of the second fin layer adjacent to the first groove to form a first fin recess between two adjacent first fin layers; removing a portion of the second fin layer adjacent to the second groove to form a second fin recess between two adjacent first fin layers, where a size of the first fin recess along an extending direction of the fin is greater than a size of the second fin recess along the extending direction of the fin; forming a first spacer layer in the first fin recess, where sidewalls of the first spacer layer are coplanar with sidewalls of the first fin layer exposed by the first groove; forming a second spacer layer in the second fin recess, where sidewalls of the second spacer layer are coplanar with sidewalls of the first fin layer exposed by the first groove; after forming the first spacer layer, forming a doped drain layer in the first groove; and after forming the second spacer layer, forming a doped source layer in the second groove.

Another aspect of the present disclosure includes a semiconductor device fabricated by embodiments of the present disclosure. The semiconductor device includes: a substrate; a fin on the substrate, where the fin includes a plurality of first fin layers stacked along a normal direction of a surface of the substrate; a gate structure on the fin, where the gate structure is also between two adjacent first fin layers; a doped source layer and a doped drain layer on two sides of the gate structure, where the doped drain layer on one side of the gate structure and the doped source layer on the other side of the gate structure; a first spacer layer and a second spacer layer, which are between the adjacent first fin layers, where the first spacer layer is between the doped drain layer and the gate structure, the second spacer layer is between the doped source layer and the gate structure, a size of the first spacer layer along a extending direction of the fin is larger than a size of the second fin layer along the extending direction of the fin; and a dielectric layer on the substrate and the fin, where the dielectric layer covers sidewalls of the gate structure, sidewalls and a top surface of the doped source layer, and sidewalls and a top surface of the doped drain layer and exposes a top surface of the gate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Semiconductor device and fabrication method are provided. The method includes: providing a substrate having a fin, where the fin has a plurality of first fin layers stacked along a normal direction of a substrate surface and a second fin layer between two adjacent first fin layers; forming a dummy gate structure across the fin, where the dummy gate structure covers a portion of a top surface and sidewall surfaces of the fin; after forming the dummy gate structure, respectively forming a first groove and a second groove in the fin on two sides of the dummy gate structure; removing a portion of the second fin layer adjacent to the first groove to form a first fin recess between two adjacent first fin layers; removing a portion of the second fin layer adjacent to the second groove to form a second fin recess between two adjacent first fin layers, where a size of the first fin recess along an extending direction of the fin is greater than a size of the second fin recess along the extending direction of the fin; forming a first spacer layer in the first fin recess, where sidewalls of the first spacer layer are coplanar with sidewalls of the first fin layer exposed by the first groove; forming a second spacer layer in the second fin recess, where sidewalls of the second spacer layer are coplanar with sidewalls of the first fin layer exposed by the first groove; after forming the first spacer layer, forming a doped drain layer in the first groove; and after forming the second spacer layer, forming a doped source layer in the second groove.

Figure 1:
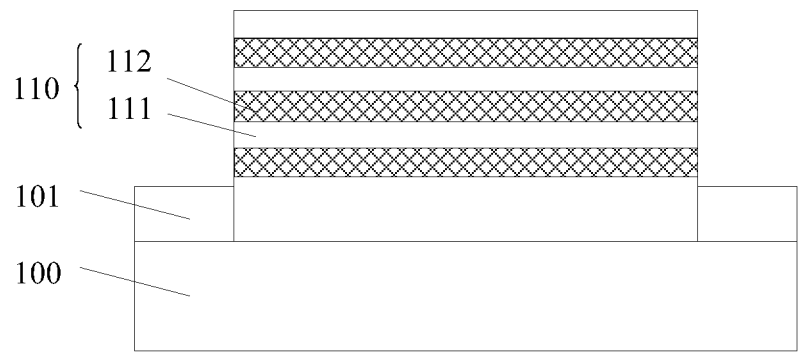
FIGS. 1-3 illustrate structural schematics corresponding to certain stages for forming a semiconductor device.
Figure 2:
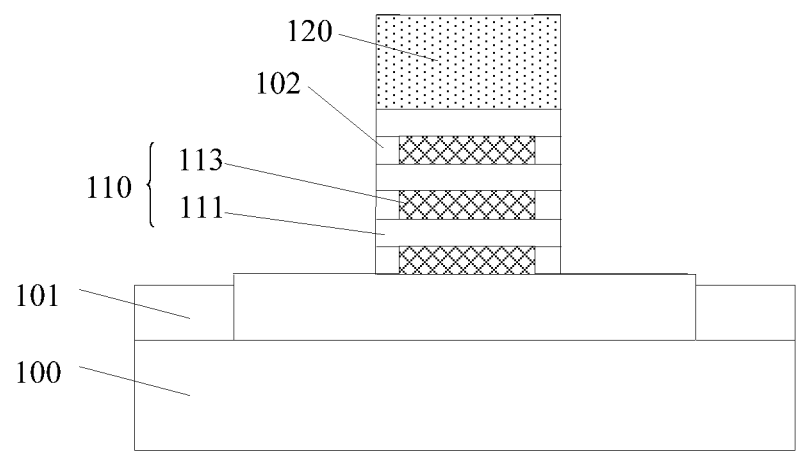
Figure 3:
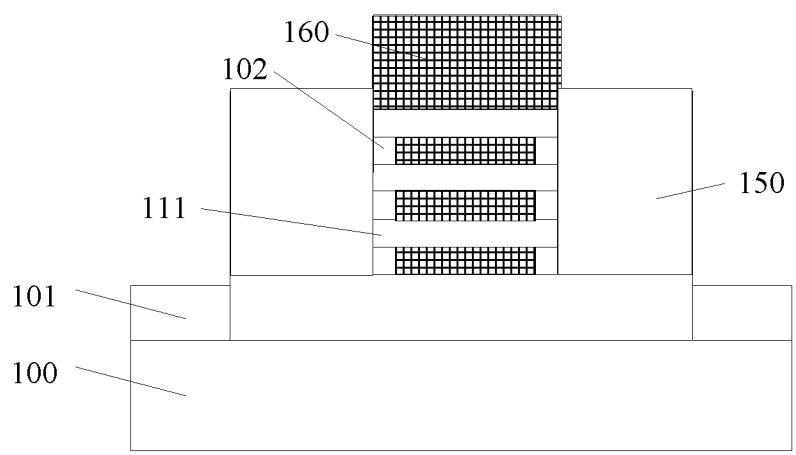

FIGS. 1-3 illustrate structural schematics corresponding to certain stages for forming a semiconductor device.

Referring to FIG. 1, a semiconductor substrate 100 may be provided. A fin 110 and an isolation structure 101 may be over the semiconductor substrate 100. The fin 110 may include a plurality of first fin layers 111 stacked along a normal direction of a surface of the semiconductor device 100, and a second fin layer 112 may be between two adjacent first fin layers.

Referring to FIG. 2, a dummy gate structure 120 across the fin 110 may be formed. Using the dummy gate structure 120 as a mask, the fin 110 on two sides of the dummy gate structure 120 may be removed to form grooves. After forming the grooves, a portion of the second fin layers 112 exposed by the grooves may be removed to form fin recesses and also form second modified fin layers 113 simultaneously. After forming the fin recesses, spacer layers 102 may be formed in the fin grooves.

Referring to FIG. 3, a doped source/drain layer 150 may be epitaxially formed in the grooves on two sides of the dummy gate structure 120. The doped source/drain layer 150 may have source/drain dopant ions. After forming the doped source/drain layer 150, the dummy gate structure 120 and the second modified fin layers 113 may be removed to form a gate opening. A gate structure 160 may be formed in the gate opening, and may also be between adjacent first fin layers 111.

The spacer layers 102 may be between the gate structure 160 and the doped source/drain layer 150, which may increase a distance between the gate structure 160 and the doped source/drain layer 150. In addition, the spacer layers 102 may be an insulating material, which may reduce the parasitic capacitance between the gate structure 160 and the doped source/drain layer 150. The larger the size of the spacer layer 102 along an extending direction of the fin, the smaller the parasitic capacitance between the gate structure 160 and the doped source/drain layer 150. However, if the size of the spacer layer along the extending direction of the fin is too large, a stress of the doped source/drain layer 150 on the channel may be reduced. If the size of the spacer layer along the extending direction of the fin is too small, the parasitic capacitance between the gate structure 160 and the doped source/drain layer 150 may be relatively large, and the parasitic capacitance between the drain and the gate structure may be further increased when the voltage applied to the drain of the doped source/drain layer 150 is excessively large, which may result in poor performance of the semiconductor device.

First spacer layers and second spacer layers may be formed in the present disclosure. The first spacer layers may be between the doped drain layer and the gate structure, and the second spacer layers may be between the doped source layer and the gate structure. Furthermore, a size of a first doped layer along the extending direction of the fin may be larger than a size of a second doped layer along the extending direction of the fin. In such way, the doped drain layer may be relatively far from the gate structure. When a relatively high voltage is applied to the drain, due to that the doped drain layer is relatively far from the gate structure, the parasitic capacitance generated by applying the voltage on the drain and the parasitic capacitance between the drain and the gate structure may be relatively small, and the parasitic capacitance of the formed semiconductor device may be relatively small, which may improve the semiconductor device performance.

In order to further illustrate the above described objects, features, and advantages of the present disclosure, various specific embodiments of the present disclosure will be described in detail below with reference to the accompanying drawings.

FIGS. 4-14 illustrate structural schematics corresponding to certain stages for forming an exemplary semiconductor device according to various disclosed embodiments of the present disclosure. FIG. 15 illustrates a flowchart of an exemplary method for fabricating a semiconductor device according to various disclosed embodiments of the present disclosure.

Referring to FIG. 15, a substrate having a fin may be provided, the fin including a plurality of first fin layers stacked along a normal direction of a substrate surface and a second fin layer between two adjacent first fin layers (S401).

Figure 4:
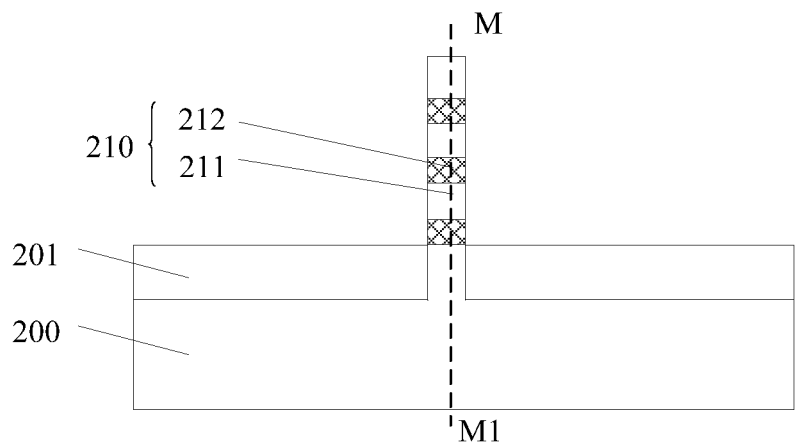
FIGS. 4-14 illustrate structural schematics corresponding to certain stages for forming an exemplary semiconductor device according to various disclosed embodiments of the present disclosure.
Figure 5:
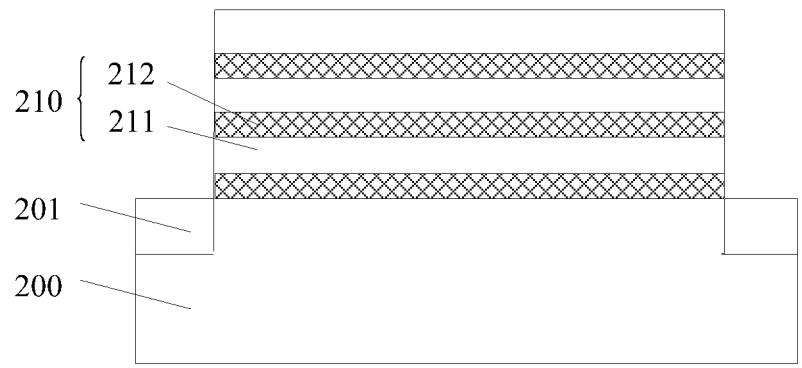

Referring to FIG. 4 and FIG. 5, FIG. 5 illustrates a cross-sectional schematic along a cut line M1-M1 in FIG. 4. A substrate may be provided. The substrate may include a semiconductor substrate 200 having a fin 210. The fin 210 may have a plurality of first fin layers 211 stacked along a normal direction of a surface of the semiconductor substrate 200. A second fin layer 212 may be between two adjacent first fin layers 211.

The semiconductor substrate 200 may be made of a material including single crystal silicon, polycrystalline silicon or amorphous silicon. The semiconductor substrate 200 may be also made of a material including silicon, germanium, silicon germanium, gallium arsenide, or any other suitable materials. In one embodiment, the material of the semiconductor substrate 200 may be single crystal silicon.

The method for forming the fin 210 may include: forming a fin material film on the semiconductor substrate 200, where the fin material film may include a plurality of first fin films stacked along the normal direction of the surface of the semiconductor substrate 200, and a second fin film may be between two adjacent first fin films; forming a patterned layer on the fin material film; using the patterned layer as a mask, etching the fin material film to form the fin 210, thereby forming the first fin layer 211 from the first fin film and forming the second fin layer 212 from the second fin film.

In one embodiment, a fin protection film (not shown) may be on a surface of the fin material film. The patterned layer may be formed on a top of the fin protection film. Using the patterned layer as the mask, a fin protection layer and the fin

210 may be formed by etching the fin protection film and the fin material film, where the fin protection layer may be on the top surface of the fin 210.

The fin protection layer may protect the top surface of the fin during the etching process for forming the fin and also during the formation of the isolation structure.

The material of the fin protection layer may be silicon nitride.

In some embodiments, the fin protection layer may be a multi-layer structure such as a composite structure of silicon oxide and silicon nitride.

In one embodiment, the fin protection layer may not be formed.

The materials of the first fin layers 211 and the second fin layers 212 may be different. For example, the material of the first fin layers 211 may be single crystal silicon and the material of the second fin layers 212 may be single crystal germanium silicon; or the material of the first fin layers 211 may be single crystal germanium silicon and the material of the second fin layers 212 may be single crystal silicon.

In one embodiment, the material of the first fin layers 211 may be single crystal silicon and the material of the second fin layers 212 may be single crystal germanium silicon.

Referring to FIG. 4 and FIG. 5, an isolation structure 201 may be formed on the semiconductor substrate 200 and may cover a portion of sidewalls of the fin 210.

A top surface of the isolation structure 201 may be lower than a top surface of the fin 210. The isolation structure 201 may be made of a material including silicon oxide.

The method for forming the isolation structure 201 may include forming an isolation structure film (not shown) covering the fin 210 on the semiconductor substrate 200; and etching back the isolation structure film to form the isolation structure 201.

The isolation structure film may be formed by a deposition process, such as a fluid chemical vapor deposition process. The fluid chemical vapor deposition process may be used to form the isolation structure film, where the isolation structure film may have a better filling performance.

The fluid chemical vapor deposition process for forming the isolation structure film may include: forming an isolation fluid layer on the semiconductor substrate 200; and performing a water vapor annealing to form the isolation structure film from the isolation fluid layer.

The parameters of the water vapor annealing may include: gases including oxygen, ozone and gaseous water, and an annealing temperature of about 250 degrees Celsius to about 750 degrees Celsius.

In one embodiment, the method may further include: before forming the isolation fluid layer, forming a protection layer (not shown) on the surface of the fin 210; and etching back the isolation structure film and the protection layer simultaneously.

The protection layer may be made of a material including silicon oxide or silicon nitride. The function of the protection layer may include isolating oxygen and the fin 210 during the water vapor annealing process to avoid the consumption of the fin 210.

Referring back to FIG. 15, a dummy gate structure may be formed across the fin and cover a portion of a top surface and sidewall surfaces of the fin (S402).

Figure 6:
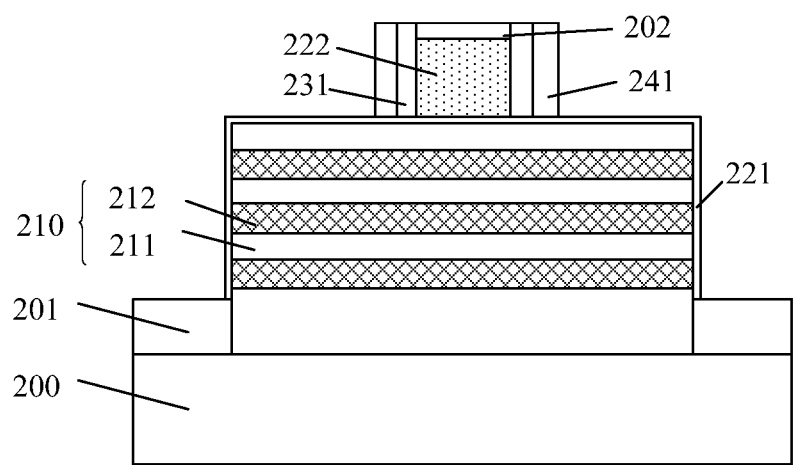

Referring to FIG. 6, a dummy gate structure across the fin 210 may be formed. The dummy gate structure may cover a portion of the top surface and sidewall surfaces of the fin 210.

The dummy gate structure may include a dummy gate structure body and spacers on sidewalls of the dummy gate structure body.

The dummy gate structure body may include a dummy gate dielectric layer and a dummy gate electrode layer on a surface of the dummy gate dielectric layer.

In one embodiment, the dummy gate dielectric layer 221 may cover the sidewalls and the top surface of the fin 210.

In one embodiment, the dummy gate dielectric layer 221 may cross the fin 210 and cover a portion of the sidewalls and the top surface of the fin 210.

The formation of the dummy gate structure body may include: forming the dummy gate dielectric layer 221, covering a portion of the top surface and the sidewall surfaces of the fin 210, on the semiconductor substrate 200; forming a dummy gate film (not shown) on the dummy gate dielectric layer 221; etching the dummy gate film till exposing the dummy gate dielectric layer 221 on the fin 210 to form a dummy gate electrode layer 222, and forming the dummy gate structure body on the fin 210.

The dummy gate dielectric layer 221 may also on a portion of the surface of the isolation structure 201.

The material of the dummy gate dielectric layer 221 may be silicon oxide, and the material of the dummy gate electrode layer 222 may be polycrystalline silicon.

The dummy gate structure body may further include a dummy gate protection layer 202 on the dummy gate surface. The dummy gate protection layer 202 may protect the dummy gate electrode layer 222 when subsequently forming the doped source/drain layer and may be used as a stop layer for planarization.

The dummy gate protection layer 202 may be made of a material including silicon oxide or silicon nitride.

In one embodiment, the material of the dummy gate protection layer 202 may be silicon nitride.

In one embodiment, the spacers may include first spacers 231 and second spacers 241. The first spacers 231 and the second spacers 241 may be on the surface of the dummy gate dielectric layer 221. The first spacers 231 may be on two sides of the dummy gate structure body and cover sidewalls of the dummy gate electrode layer 222 and sidewalls of the dummy gate protection layer 202. The second spacers 241 may cover sidewall surfaces of the first spacers 231.

The first spacers 231 may be used to define the position of a lightly doped region.

The method for forming the first spacers 231 may include: forming a first spacer material layer over the isolation structure 201, the fin 210 and the dummy gate structure body; etching the first spacer material layer till exposing the top surface of the dummy gate dielectric layer 221 and the top surface of the dummy gate protection layer 202, and forming the first spacers 231, covering the sidewalls of the dummy gate structure body, on the dummy gate dielectric layer 221.

The first spacer material layer may be formed by one or a combination of a chemical vapor deposition process, a physical vapor deposition process or an atomic layer deposition process.

The first spacers 231 may be made of a material including silicon oxide, silicon nitride, silicon oxynitride, silicon oxycarbide, silicon carbonitride, silicon oxycarbonitride.

In one embodiment, the material of the first spacers 231 may be silicon nitride.

The second spacers 241 may be used to define positions of the doped source region and the doped drain region.

The second spacers 241 may be on two sides of the dummy gate structure body and the first spacers 231 and may cover the sidewall surfaces of the first spacers 231.

The method for forming the second spacers 241 may include: forming a second spacer material layer over the isolation structure 201, the fin 210, the dummy gate structure body and the first spacers 231; etching the second spacer material layer till exposing the top surface of the dummy gate dielectric layer 221 and the top surface of the dummy gate protection layer 202, and forming the second spacers 241, covering the sidewalls of the first spacers 231, on the dummy gate dielectric layer 221.

The second spacer material layer may be formed by one or a combination of a chemical vapor deposition process, a physical vapor deposition process or an atomic layer deposition process.

The second spacers 241 may be made of a material including silicon oxide, silicon nitride, silicon oxynitride, silicon oxycarbide, silicon carbonitride, silicon oxycarbonitride.

In one embodiment, the material of the second spacers 241 may be silicon nitride.

Referring back to FIG. 15, after forming the dummy gate structure, a first groove and a second groove may be respectively formed in the fin on two sides of the dummy gate structure (S403).

Figure 7:
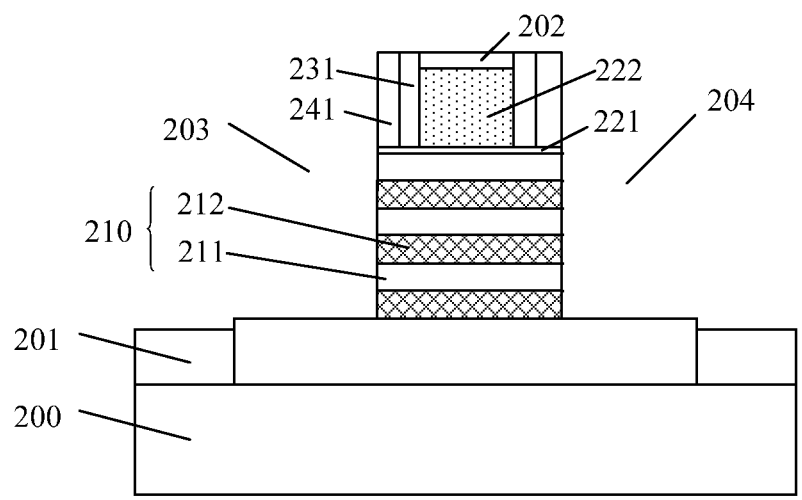

Referring to FIG. 7, after forming the dummy gate structure, a first groove 203 and a second groove 204 may be formed in the fin 210 on two sides of the dummy gate structure.

After forming the second spacers 241, the fin 210 on two sides of the dummy gate structure may be etched using the dummy gate structure 220, the first spacers 231 and the second spacers 241 as a mask.

The first groove 203 may provide space for subsequently forming the doped drain layer.

The second groove 204 may provide space for subsequently forming the doped source layer.

The process for etching the fin 210 on two sides of the dummy gate structure may be an anisotropic dry etching. The parameters of the dry etching process may include an etching gas including HBr and Ar, where a flow rate of HBr may be about 10 sccm to about 1000 sccm, and a flow rate of the Ar may be about 10 sccm to about 1000 sccm.

In one embodiment, the first groove 203 and the second groove 204 may be formed in a same step.

In one embodiment, the second groove may be formed after forming the first groove.

In one embodiment, the first groove may be formed after forming the second groove.

After forming the first groove 203 and the second groove 204, a portion of the second fin layer 212 on the sidewalls of the first groove 203 may be removed to form a first fin recess 205, where the first fin recess 205 may be between adjacent first fin layers 211; and a portion of the second fin layer 212 on the sidewalls of the second groove 204 may be removed to form a second fin recess 206, where the second fin recess 206 may be between adjacent first fin layers 211. A size of the first fin recess 205 along the extending direction of the fin 210 may be greater than a size of the second fin recess 206 along the extending direction of the fin 210.

The method for forming the first fin recess 205 may include etching and removing a portion of the second fin layer 212 exposed by the first groove 203 such that the second fin layer 212 of the sidewall of the first groove 203 may be concave with respect to the first fin layer 211, where the first fin recess 205 may be formed between the first fin layers 211.

The method for forming the second fin recess 206 may include etching and removing a portion of the second fin layer 212 exposed by the second groove 204 such that the second fin layer 212 of the sidewall of the second groove 204 may be concave with respect to the first fin layer 211, where the second fin recess 206 may be formed between the first fin layers 211. The time for etching and removing the portion of the second fin layer 212 exposed by the second groove 204 may be less than the time for etching and removing the portion of the second fin layer 212 exposed by the first groove 203.

In one embodiment, the second fin recess 206 may be formed after forming the first fin recess 205.

In one embodiment, the first fin recess 205 may be formed after forming the second fin recess 206.

In one embodiment, the first fin recess 205 and the second fin recess 206 may be formed in a same step. The method for forming the first fin recess 205 and the second fin recess 206 may refer to FIGS. 8-9.

Figure 8:
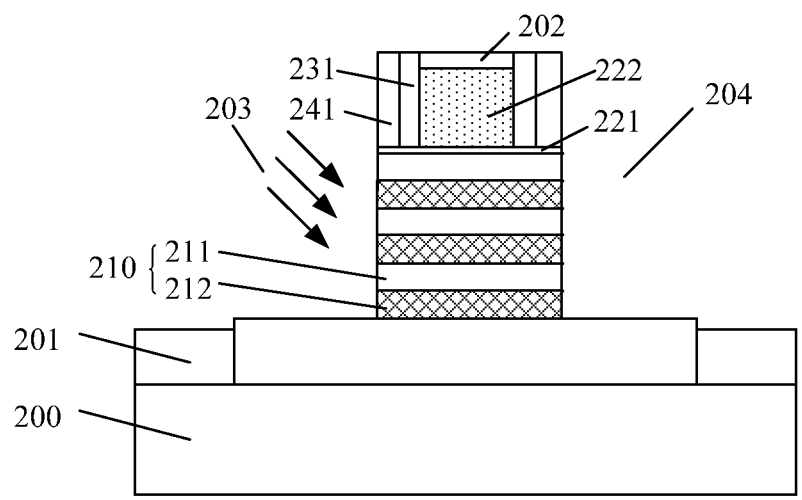

Referring to FIG. 8, an ion doping may be performed in the fin 210 exposed by the first groove 203, and an ion doped region may be formed in the fin 210 of the sidewall of the first groove 203.

Doping the ions may be an ion implantation process.

The implanted ions of the ion implantation process may be silicon ions or carbon ions.

In one embodiment, the implanted ions may be silicon ions.

The material of the first fin layer 211 may be silicon and the material of the second fin layer 212 may be silicon germanium. In such way, when the implanted ions are silicon ions, the second fin layer 212 may be doped while the first fin layer may not be affected, and the ion doped region may be only in the second fin layer. The etching selectivity between the ion doped region and the second fin layer may be subsequently used for removing the ion doped region, thereby forming the first fin recess.

The parameters of the ion implantation process may include: silicon ions as the implanted ions, an implantation energy of about 1 Kev to about 15 Kev, and an implantation dose of about 1.0E13 atom/cm$^2$ to about 5.0E17 atom/cm$^2$.

In some embodiments, the implanted ions may be carbon ions. The parameters of the ion implantation process may include: carbon ions as the implanted ions, an implantation energy of about 0.5 Kev to about 10 Kev, and an implantation dose of about 1.0E13 atom/cm$^2$ to about 5.0E17 atom/cm$^2$.

The ion doped region may be in the first fin layer 211 and the second fin layer 212, which are exposed by the first groove 203. The etching selectivity between the second fin layer with dopant ions and the second fin layer without dopant ions may be subsequently used to remove the ion doped region in the second fin layer 212. A size of the first fin recess may be larger than a size of the second fin recess formed by removing the second fin layer 212.

Referring back to FIG. 15, a portion of the second fin layer adjacent to the first groove may be removed to form a first fin recess between two adjacent first fin layers (S404). A portion of the second fin layer adjacent to the second groove may be removed to form a second fin recess between two adjacent first fin layers, where a size of the first fin recess along an extending direction of the fin is greater than a size of the second fin recess along the extending direction of the fin (S405).

Figure 9:
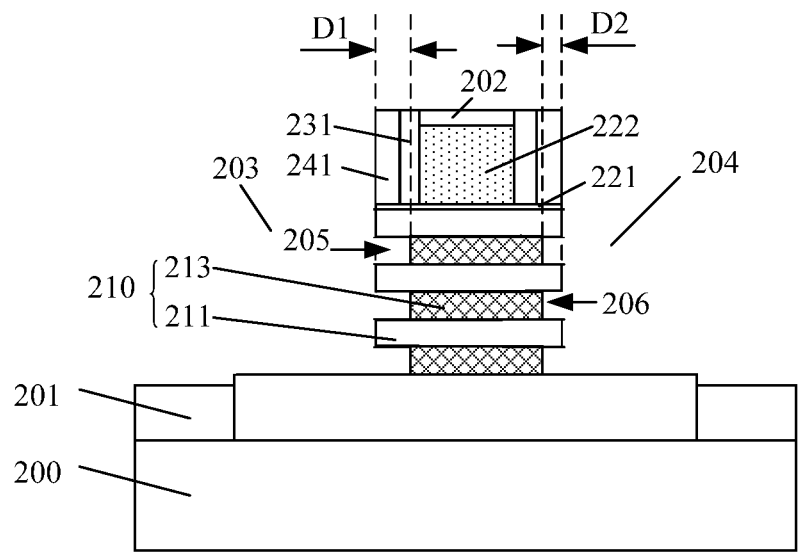

Referring to FIG. 9, after forming the ion doped region, the doped region in the second fin layer 212 exposed by the first groove 203 and a portion of the second fin layer 212 exposed by the second groove 204 may be removed. The first fin recess 205 may be formed on the sidewall of the first groove 203, and the second fin recess 206 may be formed on the sidewall of the second groove 204. The first fin recess 205 and the second fin recess 206 may be between two adjacent first fin layers 211.

After forming the first fin recess 205 and the second fin recess 206, a second modified fin layer 213 may be formed from the second fin layer 212. A sidewall of the second modified fin layer 213 may be concave with respect to the sidewall of the first fin layer 211.

The process for removing the ion doped region in the second fin layer exposed by the first groove and the portion of the second fin layer exposed by the second groove may be an etching process. For the etching process, an etching rate of the ion doped region may be larger than an etching rate of the second fin layer, so the size of the formed first fin recess 205 may be larger than the size of the formed second fin recess 206.

The process for removing the ion doped region in the second fin layer 212 exposed by the first groove 203 and the portion of the second fin layer 212 exposed by the second groove 204 may include an isotropic wet etching process or an isotropic dry etching process.

In one embodiment, the process for removing the ion doped region in the second fin layer 212 exposed by the first groove 203 and the portion of the second fin layer 212 exposed by the second groove 204 may include an isotropic wet etching process. The process parameters may include an etching solution containing HCl gas, a temperature of about 25 degrees Celsius to about 300 degrees Celsius, and a volume percentage of the solution containing HCl gas of about 30% to about 95%.

The wet etching solution may have a better selectivity of silicon, silicon germanium and silicon germanium with doped silicon, which may ensure that the silicon topography may not be affected while removing silicon germanium and silicon germanium with doped silicon. The etching solution's etching selectivity of silicon, silicon germanium and silicon germanium with doped silicon may be about 1:10-80:50-300. When the damage to silicon is relatively small, the etching rate of silicon germanium with doped silicon may be relative fast and the etching rate of silicon germanium may be certain, so the size of the formed first fin recess along the extending direction of the fin may be larger than the size of the formed second fin recess along the extending direction of the fin.

In one embodiment, the material of the first fin layer may be silicon, the material of the second fin layer may be silicon germanium, and the material of the ion doped region may be silicon germanium with doped silicon. Therefore, the solution containing HCl gas may have a better selectivity.

The first fin recess 205 may be subsequently used to form a first spacer layer 208.

The second fin recess 206 may be subsequently used to form a second spacer layer 209.

A size D1 of the first fin recess 205 along the extending direction of the fin may be larger than a size D2 of the second fin recess 206 along the extending direction of the fin.

A ratio between the size of the second fin recess along the extending direction of the fin and the size of the first fin recess along the extending direction of the fin may be about 1:4 to about 5:6.

The size D1 of the first fin recess 205 along the extending direction of the fin may be about 2.5 nm to about 5 nm.

The size D2 of the second fin recess 206 along the extending direction of the fin may be about 1.5 nm to about 3 nm.

After forming the first fin recess 205 and the second fin recess 206, the first spacer layer 208 may be formed in the first fin recess 205, where a sidewall of the first spacer layer 208 may be coplanar with the first fin layer 211 exposed by the first groove 203; the second spacer layer 209 may be formed in the second fin recess 206, where a sidewall of the second spacer layer 209 may be coplanar with the first fin layer 211 exposed by the second groove 204.

In one embodiment, the second spacer layer 209 may be formed after forming the first spacer layer 208.

In one embodiment, the first spacer layer 208 may be formed after forming the second spacer layer 209.

In one embodiment, the first spacer layer 208 and the second spacer layer 209 may be formed in a same step. The forming method of the first spacer layer 208 and the second spacer layer 209 may refer to FIG. 10 and FIG. 11.

Figure 10:
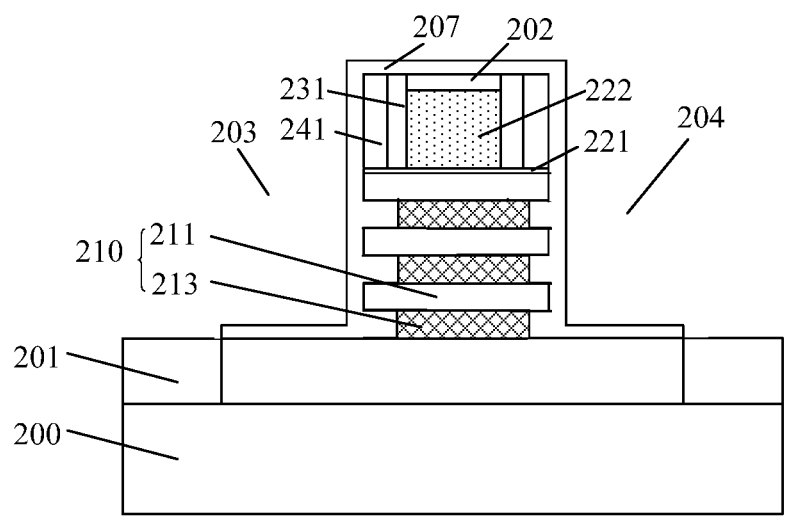

Referring to FIG. 10, after forming the first fin recess 205 and the second fin recess 206, an initial spacer layer 207 may be formed on the dummy gate structure and the fin 210, and in the first groove 203 and the second groove 204.

The initial spacer layer 207 may provide a material layer for subsequently forming the first spacer layer 208 and the second spacer layer 209.

The initial spacer layer 207 may cover the bottom surface of the first groove 203, the bottom surface of the second groove 204, the first fin recess 205, the second fin recess 206, the top surface of the dummy gate structure, and the sidewalls and the top surface of the second spacer 241. The initial spacer layer 207 may also cover the sidewalls of the first fin layer 211 and the second modified fin layer 213 of the fin 210 exposed by the first groove 203 and the second groove 204.

The initial spacer layer 207 may be formed by one or a combination of a chemical vapor deposition process, a physical vapor deposition process or an atomic layer deposition process. The initial spacer layer 207 may be made of a material including silicon oxide, silicon nitride, silicon oxynitride, silicon oxycarbide, silicon carbonitride, silicon oxycarbonitride.

In one embodiment, the initial spacer layer 207 may be formed by an atomic layer deposition. The material of the initial spacer layer 207 may be silicon nitride. The parameters of the atomic layer deposition process may include: a mixed gas of $SiH_2Cl_2$ and $NH_3$, a flow rate of the mixed gas of about 1500 sccm to about 4000 sccm, a pressure of about 1 mtorr to about 10 mtorr, a temperature of about 200 degrees Celsius to about 600 degrees Celsius, and deposition times of about 30 to about 100.

The atomic layer deposition process may have better step coverage and uniform film formation. The formed spacer layer may have better filling effect in the fin recesses.

In other embodiments, the initial spacer layer 207 may be formed by a chemical vapor deposition process. The material of the initial spacer layer 207 may be silicon oxide.

Referring back to FIG. 15, a first spacer layer may be formed in the first fin recess, where sidewalls of the first spacer layer are coplanar with sidewalls of the first fin layer exposed by the first groove; and a second spacer layer may be formed in the second fin recess, where sidewalls of the second spacer layer are coplanar with sidewalls of the first fin layer exposed by the first groove (S406).

Figure 11:
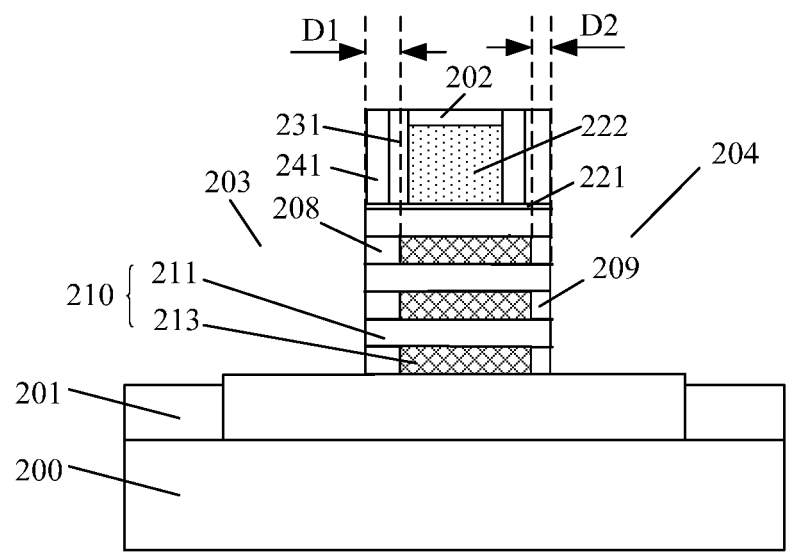

Referring to FIG. 11, after forming the initial spacer layer 207, a portion of the initial spacer layer 207 may be removed, thereby forming the first spacer layer 208 in the first fin recess 205 and forming the second spacer layer 209 in the second fin recess 206.

The first spacer layer 208 may be used to isolate the doped drain layer and the gate structure.

The second spacer layer 209 may be used to isolate the doped source layer and the gate structure.

Removing the portion of the initial spacer layer 207 may include: etching back the initial spacer layer 207 till exposing the bottom surface of the first groove 203 and the bottom surface of the second groove 204; after etching backing the initial spacer layer 207, using the dummy gate structure as a mask, etching the initial spacer layer 207 till exposing the sidewall surfaces of the dummy gate structure, and forming the first spacer layer 208 in the first fin recess 205 and the second spacer layer 209 in the second fin recess 206.

The first spacer layer 208 may expose the sidewall of the first fin layer 211 and the bottom surface of the first groove 203 exposed by the first groove 203. The sidewall of the first spacer layer 208 may be coplanar with the sidewall of the first fin layer 211 exposed by the first groove 203.

The second spacer layer 209 may exposed the sidewall of the first fin layer 211 and the bottom surface of the second groove 204 exposed by the second groove 204. The sidewall of the second spacer layer 209 may be coplanar with the sidewall of the first fin layer 211 exposed by the second groove 204.

The size D1 of the first spacer layer 208 along the extending direction of the fin may be larger than the size D2 of the second spacer layer 209 along the extending direction of the fin.

The first spacer layer 208 may be between the doped drain layer and the gate structure, and the second spacer layer 209 may be between the doped source layer and the gate structure. In such way, the doped source layer may be relatively close to the gate structure subsequently formed and may have relatively strong channel control. The doped drain layer may be relatively far from the gate structure subsequently formed, and the parasitic capacitance between the doped drain layer and the gate structure may be relatively small. When a relatively high voltage is applied to the drain, due to the doped drain layer is relatively far from the gate structure, the parasitic capacitance generated by applying the voltage on the drain may be relatively small, that is, the parasitic capacitance of the formed semiconductor device may be relatively small, which may improve the performance of the semiconductor device.

In the extending direction of the fin, a ratio between the size of the second spacer layer 209 and the size of the first spacer layer 208 may be about 1:4 to about 5:6.

If the ratio between the size of the second spacer layer 209 and the size of the first spacer layer 208 is too large, the size of the first spacer layer 208 may be too small when the size of the second spacer layer 209 is constant. When a voltage is applied to the doped drain layer, the parasitic capacitance between the doped drain layer and the gate structure subsequently formed may be relatively large. If the ratio of the size between the second spacer layer 209 and the size of the first spacer layer 208 is too small, the size of the first spacer layer 208 may be too large when the size of the second spacer layer 209 is constant. The gate structure may be between the first spacer layer 208 and the second spacer layer 209, and the size of the gate structure, the first spacer layer 208 and the second spacer layer 209 may have a same size as the first fin layer. The size of the first fin layer may be fixed, so the size of the gate structure may be relative small, which may not be advantageous for the semiconductor device performance.

The size of the first spacer layer 208 in the extending direction of the fin may be D1, which may be about 2.5 nm to about 5 nm.

If the size of the first spacer layer 208 in the extending direction of the fin is too small, the distance between the doped drain layer subsequently formed and the gate structure may be relatively small, and the parasitic capacitance between the doped drain layer and the gate structure may be relatively large. If the size of the first spacer layer 208 in the extending direction of the fin is too large, the distance between the doped drain layer and the gate structure may be too large, and the channel region may be narrowed and the short-channel effect may be obvious, which may have poor performance of the semiconductor device.

The size of the second spacer layer 209 in the extending direction of the fin may be D2, which may be about 1.5 nm to about 3 nm.

If the size of the second spacer layer 209 in the extending direction of the fin is too small, the distance between the doped source layer subsequently formed and the gate structure may be relatively small, and the parasitic capacitance between the doped drain layer and the gate structure may be relatively large. If the size of the second spacer layer 209 in the extending direction of the fin is too large, the distance between the doped drain layer and the gate structure may be too large, the stress of the doped source layer on the channel may be reduced, and the performance of the semiconductor device may be required to be improved.

The initial spacer layer 207 may be etched back by an anisotropic dry etching process. The parameters of the anisotropic dry etching process may include: gases including $CF_4$ and $CHF_3$, a flow rate of $CF_4$ of about 8 sccm to about 500 sccm, a flow rate of $CHF_3$ of about 30 sccm to about 200 sccm, a chamber pressure of about 10 mtorr to about 2000 mtorr, a radio frequency power of about 100 W to about 1300 W, a bias voltage of about 80 V to about 500 V, and a time duration of about 4 s to about 500 s.

In one embodiment, the initial spacer layer 207 on the sidewalls of the second spacer 241 and the fin 210 may be etched and removed by an anisotropic dry etching process. The parameters of the anisotropic dry etching process may include: gases including $CF_4$, $CH_2F_2$ and $O_2$, a flow rate of $CF_4$ of about 30 sccm to about 200 sccm, a flow rate of $CH_2F_2$ of about 8 sccm to about 50 sccm, a flow rate of $O_2$ of about 2 sccm to about 30 sccm, a chamber pressure of about 10 mtorr to about 2000 mtorr, a radio frequency power of about 100 W to about 1000 W, a bias voltage of about 30 V to about 500 V, and a time duration of about 4 s to about 500 s.

In one embodiment, the initial spacer layer 207 on the sidewalls of the second spacer 241 and the fin 210 may be etched and removed by an isotropic dry etching process.

In other embodiments, the initial spacer layer 207 on the sidewalls of the second spacer 241 and the fin 210 may be etched and removed by an isotropic dry etching process.

Referring back to FIG. 15, after forming the first spacer layer, a doped drain layer may be formed in the first groove; and after forming the second spacer layer, a doped source layer may be formed in the second groove (S407).

Figure 12:
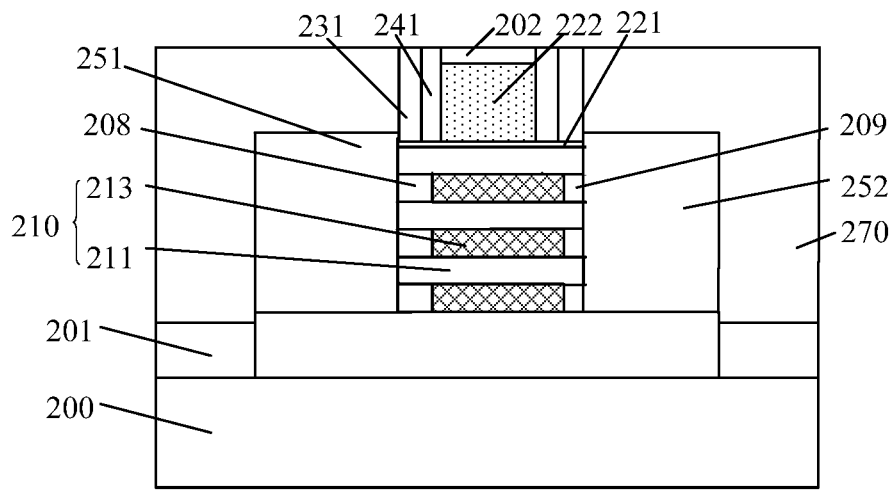

Referring to FIG. 12, after forming the first spacer layer 208 and the second spacer layer 209, a doped drain layer 251 may be formed in the first groove 203 and a doped source layer 252 may be formed in the second groove 204.

The doped drain layer 251 and the doped source layer 252 may be on two sides of the dummy gate structure.

The first spacer layer 208 may be between the doped drain layer 251 and the second modified fin 213, and the second spacer layer 209 may be between the doped source layer 252 and the second modified fin 213.

The first spacer layer 208 may be between the doped drain layer 251 and the gate structure subsequently formed, and the second spacer layer 209 may be between the doped source layer 252 and the gate structure subsequently formed. The distance between the doped drain layer 251 and the gate structure may be relatively large, and the parasitic capacitance between the doped drain layer 251 and the gate structure may be relatively small. When a relatively large voltage is applied to the doped drain layer 251, due to the relatively large distance between the doped drain layer 251 and the gate structure, the parasitic capacitance generated by applying the voltage on the drain may be relatively small, which may improve the performance of the semiconductor device.

The doped drain layer 251 and the doped source layer 252 may have source/drain dopant ions.

The materials and the dopant ions of the doped drain layer 251 and the doped source layer 252 may be same.

The doped drain layer 251 and the doped source layer 252 may be formed by an epitaxial growth process. The process of doping the source/drain dopant ions in the doped drain layer 251 and the doped source layer 252 may be an in-situ doping process.

When the semiconductor device is a P-type device, the doped drain layer 251 and the doped source layer 252 may be made of a material including silicon, germanium or silicon germanium. The source/drain dopant ions may be P-type ions including boron ions, $Br^{2-}$ ions or indium ions. When the semiconductor device is a N-type device, the doped drain layer 251 and the doped source layer 252 may be made of a material including silicon, gallium arsenide or indium gallium arsenide. The source/drain dopant ions may be N-type ions including phosphorus ions or arsenic ions.

In one embodiment, when the semiconductor device is a P-type device, the doped drain layer 251 and the doped source layer 252 may be made of a material including silicon, and the source/drain dopant ions may be boron ions. In other embodiments, the semiconductor device may be a N-type device, the doped drain layer 251 and the doped source layer 252 may be made of a material including silicon, and the source/drain dopant ions may be phosphorus ions.

Referring to FIG. 12, after forming the doped drain layer 251 and the doped source layer 252, a dielectric layer 270 may be formed over the semiconductor substrate 200 and the fin 210. The dielectric layer 270 may cover the sidewalls of the dummy gate structure.

For example, after forming the doped drain layer 251 and the doped source layer 252, the dielectric layer 270 may be formed over the semiconductor substrate 200, the isolation structure 201 and the fin 210. The dielectric layer 270 may cover the sidewalls of the first spacer 231 and expose the top surface of the dummy gate structure.

The material of the dielectric layer 270 may be silicon oxide.

The formation of the dielectric layer 270 may include: forming an dielectric material film (not shown) over the semiconductor substrate 200, the isolation structure 201 and the fin 210, where the dielectric material film may cover the top surface of the dummy gate structure; and planarizing the dielectric material film till exposing the top surface of the dummy gate structure to form the dielectric layer 270.

The dielectric material film may be formed using a deposition process such as a plasma chemical vapor deposition process or a fluid chemical vapor deposition process. The dielectric material film may be planarized using a chemical mechanical polishing process or an etching back process.

Figure 13:
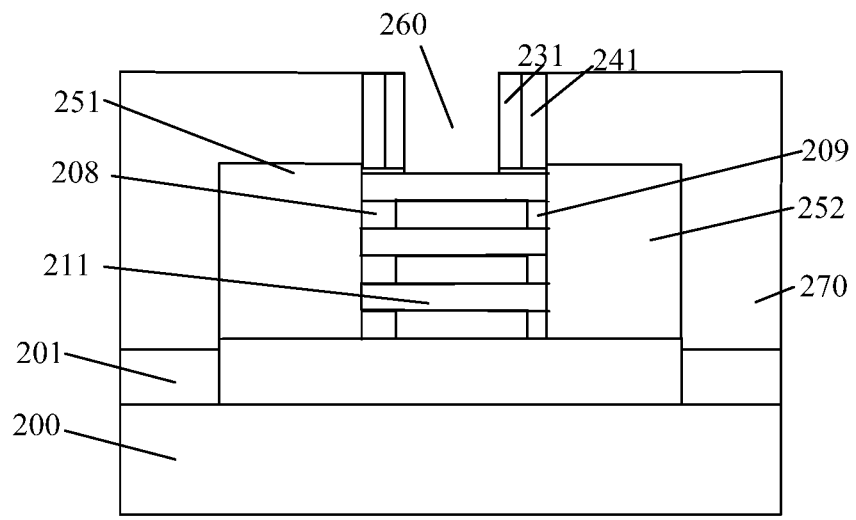

Referring to FIG. 13, after forming the dielectric layer 270, the dummy gate structure body and the second modified fin layer 213 covered by the dummy gate structure body may be removed. A gate opening 260 may be formed in the dielectric layer 270 and may be between adjacent first fin layers 211.

Removing the dummy gate structure body and the second modified fin layer 213 covered by the dummy gate structure body may include: removing the dummy gate electrode layer 222 and the dummy gate dielectric layer 221 exposed by the dummy gate electrode layer, and forming an initial gate opening (not shown) in the dielectric layer; and removing the second modified fin layer 213 exposed by the initial gate opening and forming the gate opening 260 from the initial gate opening.

The second modified fin layer 213 exposed by the initial gate opening may be removed by a dry etching process.

In one embodiment, the material of the first fin layer 211 may be single crystal silicon, and the material of the second modified fin layer 213 may be single crystal germanium silicon. The second modified fin layer 213 exposed by the initial gate opening may be removed by a dry etching process, where the process parameters may include: a total used gas including an etching gas and a diluent gas, the etching gas including HCl, the diluent gas including $N_2$, a molar percentage of the etching gas to the total gas, which is about 20% to about 90%, and a temperature of about 100 degrees Celsius to about 200 degrees Celsius (e.g., 150 degrees Celsius).

In the dry etching process used to remove the second modified fin layer 213 exposed by the initial gate opening, the etching gas may include HCl. HCl gas may have a better chemical reactivity, and the reaction rate between the HCl and the second modified fin layer 213 may be relatively fast, so the etching selectivity of the second modified fin layer 213 with respect to the first fin layer 211 in the dry etching process may be relatively large.

In one embodiment, the dry etching process may be used to remove the second modified fin layer 213 exposed by the initial gate opening. The etching selectivity value of the second modified fin layer 213 with respect to the first fin layer 211 may be about 50 to about 200.

In the dry etching process used to remove the second modified fin layer 213 exposed by the initial gate opening, if the temperature is too high, the etching reaction rate may be too fast, and the uniformity of the etching rate at each region may be reduced. Therefore, the first fin layer 211 may have a relatively large surface roughness, and the difficulty of subsequently repairing the surface of the first fin layer 211 may be increased. However, in the dry etching process, a temperature of about 100 degrees Celsius to about 200 degrees Celsius may be used, which may have a relatively fast reaction rate and also reduce the difficulty of subsequently repairing the surface of the first fin layer 211.

Figure 14:
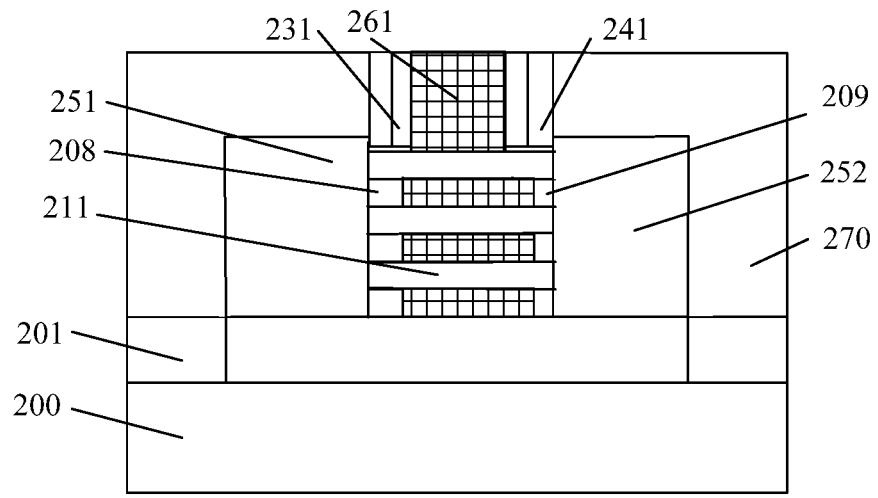
Figure 15:
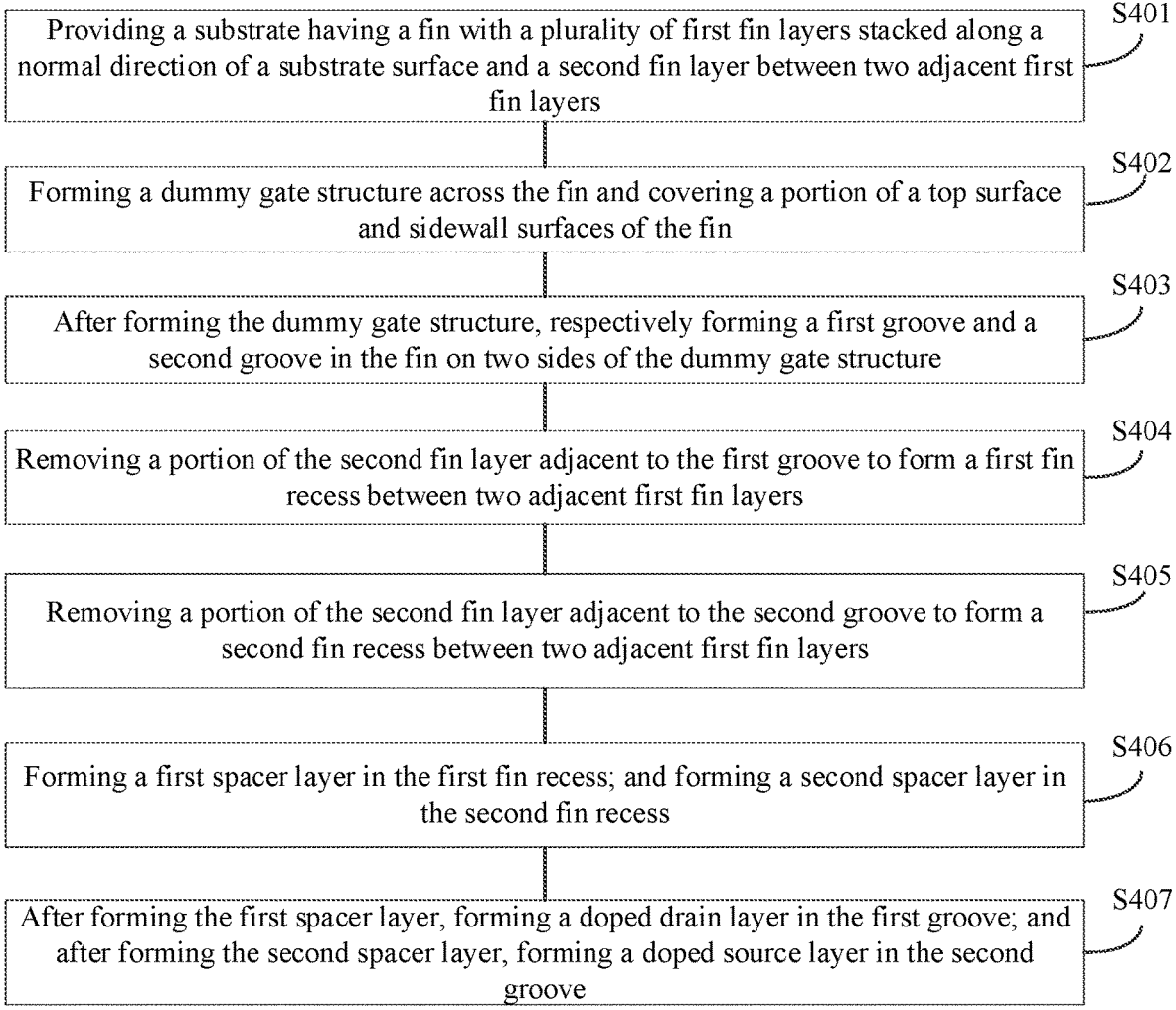
FIG. 15 illustrates a flowchart of an exemplary method for fabricating a semiconductor device according to various disclosed embodiments of the present disclosure.

Referring to FIG. 14, after forming the gate opening 260, a gate structure 261 may be formed in the gate opening 260. The gate structure 261 may be between the adjacent first fin layers 211.

The gate structure 261 may also be between the adjacent first fin layers 211. For example, the gate structure 261 may also be between the adjacent first fin layers 211, which may make the gate structure 261 to surround the first fin layers 211, thereby increasing the ability of the gate structure 261 to control the channel.

The gate structure 261 may include a gate dielectric layer (not shown) surrounding the first fin layer 211 and a gate electrode layer (not shown) covering the gate dielectric layer. For example, the gate dielectric layer may be on the sidewalls and the bottom of the gate opening 260. The gate dielectric layer may surround the first fin layer 211, and the gate electrode layer may cover the gate dielectric layer.

In one embodiment, the gate dielectric layer may be made of a high-k dielectric material (dielectric coefficient greater than 3.9). The high-k dielectric material may include yttrium oxide, zirconium oxide, hafnium silicon oxide, hafnium oxide, zirconium oxide silicon, titanium oxide, cerium oxide, titanium cerium oxide, titanium cerium oxide, titanium cerium oxide or aluminum oxide.

The material of the gate electrode layer may be a metal. The metal material may include one or a combination of copper, tungsten, nickel, chromium, titanium, tantalum, and aluminum.

The gate structure 261 may further include an interface layer (not shown) surrounding the first fin layer 211 exposed by the bottom of the gate opening, where the gate dielectric layer may cover the interface layer.

The interface layer may be made of a material including silicon oxide. The interface layer may be formed using an oxidation process. The function of the interface layer may include repairing the surface of the first fin layer 211 at the bottom of the gate opening 260.

Correspondingly, the present disclosure also provides a semiconductor device fabricated by the above-mentioned embodiments. Referring to FIG. 14, the semiconductor device may include: the semiconductor substrate 200, the fin 210 on the semiconductor substrate 200, where the fin 210 may include the plurality of the first fin layers 211 stacked along the normal direction of the surface of the semiconductor substrate 200; the gate structure 261 on the fin 210, where the gate structure 261 may also be between two adjacent first fin layers 211; the doped source layer 252 and the doped drain layer 251 on two sides of the gate structure 261, where the doped drain layer 251 on one side of the gate structure 261 and the doped source layer 252 on the other side of the gate structure 261; the first spacer layer 208 and the second spacer layer 209, which are between the adjacent first fin layers 211, where the first spacer layer 208 may be between the doped drain layer 251 and the gate structure 261, the second spacer layer 209 may be between the doped source layer 252 and the gate structure 261, the size of the first spacer layer 208 along the extending direction of the fin may be larger than the size of the second spacer layer 209 along the extending direction of the fin; and the dielectric layer 270 over the semiconductor substrate 200 and the fin 210, where the dielectric layer 270 may cover the sidewalls of the gate structure 261, the sidewalls and the top surface of the doped source layer 252, and the sidewalls and the top surface of the doped drain layer 251, and may expose the top surface of the gate structure 261.

The semiconductor substrate 200 may refer to the above-mentioned embodiments of the present disclosure, which may not be described in detail.

The structure and position of the gate structure 261 may refer to the above-mentioned embodiments of the present disclosure, which may not be described in detail.

The materials and positions of the doped source layer 252 and the doped drain layer 251 may refer to the above-mentioned embodiments of the present disclosure, which may not be described in detail.

From the above-mentioned embodiments, it can be seen that the technical solution provided by the present disclosure may achieve at least the following beneficial effects.

In the fabrication method of the semiconductor device provided by the technical solution of the present disclosure, the first spacer layer may be in the first fin recess and the second spacer layer may be in the second fin recess. The size of the first fin recess along the extending direction of the fin may be larger than the size of the second fin recess along the extending direction of the fin, so the size of the first spacer layer along the extending direction of the fin may be larger than the size of the second spacer layer along the extending direction of the fin. The first spacer layer may be between the doped drain layer and the gate structure formed subsequently, and the second spacer layer may be between the doped source layer and the gate structure formed subsequently. The difference between the doped source layer and the gate structure formed subsequently may be relatively small, and the parasitic capacitance between the doped source layer and the gate structure formed subsequently may be relatively large. The difference between the doped drain layer and the gate structure formed subsequently may be relatively large, and the parasitic capacitance between the doped drain layer and the gate structure may be relatively small. Furthermore, when a relatively high voltage is applied to the drain, due to the doped drain layer is relatively far from the gate structure, the parasitic capacitance generated by applying the voltage on the drain may be relatively small, that is, the parasitic capacitance of the formed semiconductor device may be relatively small, which may improve the performance of the semiconductor device.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A fabrication method of a semiconductor device, comprising:
   providing a substrate having a fin, wherein the fin has a plurality of first fin layers stacked along a normal direction of a substrate surface and a second fin layer between two adjacent first fin layers;
   forming a dummy gate structure across the fin, wherein the dummy gate structure covers a portion of a top surface and sidewall surfaces of the fin;
   after forming the dummy gate structure, respectively forming a first groove and a second groove in the fin on two sides of the dummy gate structure;
   removing a portion of the second fin layer adjacent to the first groove to form a first fin recess between two adjacent first fin layers;
   removing a portion of the second fin layer adjacent to the second groove to form a second fin recess between two adjacent first fin layers, wherein a size of the first fin recess along an extending direction of the fin is greater than a size of the second fin recess along the extending direction of the fin;
   forming a first spacer layer in the first fin recess, wherein sidewalls of the first spacer layer are coplanar with sidewalls of the first fin layer exposed by the first groove;

forming a second spacer layer in the second fin recess, wherein sidewalls of the second spacer layer are coplanar with sidewalls of the first fin layer exposed by the first groove;

after forming the first spacer layer, forming a doped drain layer in the first groove; and after forming the second spacer layer, forming a doped source layer in the second groove.

2. The fabrication method according to claim 1, wherein:
a ratio between the size of the second fin recess along the extending direction of the fin and the size of the first fin recess along the extending direction of the fin is about 1:4 to about 5:6.

3. The fabrication method according to claim 1, wherein:
the second fin recess is formed when forming the first fin recess.

4. The fabrication method according to claim 3, wherein forming the first fin recess and the second fin recess includes:
doping ions in the fin exposed by the first groove to form an ion doped region in the fin of the sidewall of the first groove; and
after forming the ion doped region, removing the doped region in the second fin layer exposed by the first groove and a portion of the second fin layer exposed by the second groove, thereby forming the first fin recess on the sidewall of the first groove and the second fin recess on the sidewall of the second groove.

5. The fabrication method according to claim 4, wherein:
the ion doped region in the second fin layer exposed by the first groove and the portion of the second fin layer exposed by the second groove are removed by an etching process; and an etching rate of the ion doped region is larger than an etching rate of the second fin layer.

6. The fabrication method according to claim 4, wherein:
doping the ions includes an ion implantation process.

7. The fabrication method according to claim 6, wherein:
implanted ions of the ion implantation process are silicon ions or carbon ions.

8. The fabrication method according to claim 1, wherein:
forming the second fin recess after forming the first fin recess.

9. The fabrication method according to claim 1, wherein:
forming the first fin recess after forming the second fin recess.

10. The fabrication method according to claim 1, wherein forming the first fin recess includes:
etching and removing a portion of the second fin layer exposed by the first groove such that the second fin layer adjacent to the first groove is concave with respect to the first fin layer, and the first fin recess is formed between the first fin layers.

11. The fabrication method according to claim 10, wherein forming the second fin recess includes:
etching and removing a portion of the second fin layer exposed by the second groove such that the second fin layer adjacent to the second groove is concave with respect to the first fin layer, and the second fin recess is formed between the first fin layers, wherein a time for etching and removing the portion of the second fin layer exposed by the second groove is less than a time for etching and removing the portion of the second fin layer exposed by the first groove.

12. The fabrication method according to claim 1, wherein:
the second spacer layer is formed when forming the first spacer layer.

13. The fabrication method according to claim 12, wherein forming the first spacer layer and the second spacer layer includes:
forming an initial spacer layer in the first groove, the second groove, the first fin recess and the second fin recess;
etching back the initial spacer layer till exposing a bottom surface of the first groove and a bottom surface of the second groove; and
after etching back the initial spacer layer, using the dummy gate structure as a mask, further etching the initial spacer layer till exposing sidewall surfaces of the dummy gate structure, thereby forming the first spacer layer in the first fin recess and forming the second spacer layer in the second fin recess.

14. The fabrication method according to claim 13, wherein
the initial spacer layer is made of a material including silicon oxide, silicon nitride, silicon oxynitride, silicon oxycarbide, silicon carbonitride or silicon oxycarbonitride.

15. The fabrication method according to claim 1, wherein:
the second spacer layer is formed after forming the first spacer layer; or
the first spacer layer is formed after forming the second spacer layer.

16. The fabrication method according to claim 1, wherein forming the fin includes:
forming a fin material film on the substrate, wherein the fin material film includes a plurality of first fin films stacked along the normal direction of the substrate surface, and a second fin film is also between two adjacent first fin films;
forming a patterned layer on the fin material film;
using the patterned layer as a mask, etching the fin material film to form the fin, and
forming the first fin layer from the first fin film and forming the second fin layer from the second fin film.

17. The fabrication method according to claim 1, wherein:
materials of the first fin layers and the second fin layers are different;
the material of the first fin layers is single crystal silicon or single crystal germanium silicon; and
the material of the second fin layers is single crystal germanium silicon or single crystal silicon.

18. The fabrication method according to claim 1, further including:
after forming the first fin recess and the second fin recess, forming a second modified fin layer from the second fin layer, wherein a sidewall of the second modified fin layer is concave with respect to the sidewall of the first fin layer, and the method further includes:
after forming the doped drain layer and the doped source layer, forming a dielectric layer which covers the sidewalls of the dummy gate structure on the substrate and the fin;
after forming the dielectric layer, removing the dummy gate structure and the second modified fin layer covered by the dummy gate structure to form a gate opening which is in the dielectric layer and between adjacent first fin layers; and
forming a gate structure surrounding the first fin layer in the gate opening.

19. The fabrication method according to claim 18, wherein removing the dummy gate structure and the second modified fin layer covered by the dummy gate structure includes:

removing the dummy gate structure to form an initial gate opening in the dielectric layer; and removing the second modified fin layer exposed by the initial gate opening to form a gate opening from the initial gate opening.

20. A semiconductor device, comprising:

a substrate;

a fin on the substrate, wherein the fin includes a plurality of first fin layers stacked along a normal direction of a substrate surface;

a gate structure on the fin, wherein the gate structure is also between two adjacent first fin layers;

a doped source layer and a doped drain layer on two sides of the gate structure, wherein the doped drain layer on one side of the gate structure and the doped source layer on the other side of the gate structure;

a first spacer layer and a second spacer layer, which are between the adjacent first fin layers, wherein the first spacer layer is between the doped drain layer and the gate structure, the second spacer layer is between the source doped layer and the gate structure, a size of the first spacer layer along a extending direction of the fin is larger than a size of the second fin layer along the extending direction of the fin; and a dielectric layer on the substrate and the fin, wherein the dielectric layer covers sidewalls of the gate structure, sidewalls and a top surface of the doped source layer, and sidewalls and a top surface of the doped drain layer, and the dielectric layer exposes a top surface of the gate structure.

* * * * *